(12) United States Patent
Yamamoto (10) Patent No.: US 10,115,452 B2
(45) Date of Patent: Oct. 30, 2018

(54) SEMICONDUCTOR DEVICE

(71) Applicant: Renesas Electronics Corporation, Tokyo (JP)

(72) Inventor: Yoshiki Yamamoto, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/620,406

(22) Filed: Jun. 12, 2017

(65) Prior Publication Data

US 2017/0365330 A1 Dec. 21, 2017

(30) Foreign Application Priority Data

Jun. 15, 2016 (JP) ................. 2016-119180

(51) Int. Cl.
| | |
|---|---|
| G11C 11/4074 | (2006.01) |
| G11C 11/417 | (2006.01) |
| G05F 3/20 | (2006.01) |
| H01L 21/8238 | (2006.01) |
| H01L 27/02 | (2006.01) |
| G11C 5/14 | (2006.01) |
| H01L 27/11 | (2006.01) |
| H01L 27/12 | (2006.01) |

(52) U.S. Cl.
CPC ............ *G11C 11/417* (2013.01); *G05F 3/205* (2013.01); *G11C 5/146* (2013.01); *H01L 21/823892* (2013.01); *H01L 27/0222* (2013.01); *H01L 27/1104* (2013.01); *H01L 27/1203* (2013.01)

(58) Field of Classification Search
CPC .................................................. G11C 11/4074
USPC .......................................................... 365/226
See application file for complete search history.

(56) References Cited

U.S. PATENT DOCUMENTS

| | | | |
|---|---|---|---|
| 2005/0047239 A1* | 3/2005 | Takahashi | ............ G11C 11/406 365/222 |
| 2010/0034031 A1* | 2/2010 | Kang | ..................... G11C 5/147 365/189.09 |
| 2015/0137239 A1* | 5/2015 | Shinohara | ........... H01L 27/0922 257/347 |
| 2016/0028347 A1* | 1/2016 | Okamoto | ................. H03B 5/24 331/108 R |

FOREIGN PATENT DOCUMENTS

JP 2005-251776 A 9/2005

* cited by examiner

*Primary Examiner* — Min Huang
(74) *Attorney, Agent, or Firm* — Sughrue Mion, PLLC (57) ABSTRACT

A semiconductor device includes a substrate, a circuit having a transistor formed on the substrate, an oscillation circuit generating a frequency signal, a substrate voltage generation circuit generating a substrate voltage in accordance with the frequency signal from the oscillation circuit, and a control circuit varying a frequency of the frequency signal from the oscillation circuit during a stand-by period of the circuit.

7 Claims, 9 Drawing Sheets

SEMICONDUCTOR DEVICE

This nonprovisional application is based on Japanese Patent Application No. 2016-119180 filed with the Japan Patent Office on Jun. 15, 2016, the entire contents of which are hereby incorporated by reference.

BACKGROUND OF THE INVENTION

Field of the Invention

The present disclosure relates to a semiconductor device generating a substrate voltage.

Description of the Background Art

With continuous efforts for reduction in size of a semiconductor element, performance such as integration and an operation speed has continuously been improved and power consumption per single element has continuously been reduced. In a generation in which a process dimension of an element is smaller than 50 nm, however, it has become difficult to achieve both of improvement in performance and reduction in power consumption.

Factors for such a difficulty include, for example, limit of an operation current due to saturation of a carrier speed and increase in leakage current from a gate oxide film. Means for solving such a problem is represented by development of a high-dielectric-constant gate insulating film or a high-mobility channel such as strained silicon. The former aims mainly to reduce power consumption in a stand-by state of an electronic circuit by suppressing a tunnel leakage current which flows through a gate insulating film extremely made smaller in thickness. The latter aims at improvement in operation speed or reduction in power consumption while an operation speed is constant by increasing an output current with a dimension of an element being the same.

With further reduction in size, such a new problem as greater variation among elements has become more serious. With greater variation among elements, for necessity to ensure a voltage margin necessary for normal operations of all circuits, lowering in power supply voltage which has been promoted along with reduction in size has become difficult.

This means difficulty in lowering in power consumption per single element, and power consumption in a semiconductor chip which has achieved higher integration along with reduction in size will increase. Furthermore, with greater variation among elements, an element poor in power consumption performance also significantly increases power consumption in a chip as a whole. Therefore, it has become difficult to increase a circuit scale or functions without changing power consumption in chips equal in area based on reduction in size, although it had been possible so far.

A silicon on insulator (SOI) technique as shown in Japanese Patent Laying-Open No. 2005-251776 is disclosed as a technique allowing improvement in performance of a semiconductor chip with variation among elements being suppressed. Unlike the conventional SOI technique, this technique allows variation in threshold voltage of an element by employing an SOI substrate including an SOI layer and a buried oxide (BOX) layer which are very small in thickness, forming a fully-depleted silicon-on-insulator (FDSOI) element, and applying a bias voltage from a rear surface of the BOX layer.

Performance of a semiconductor chip is improved by thus varying a threshold voltage of an element, and power consumption can also be reduced by setting a threshold voltage differently between an active state and an inactive (stand-by) state.

SUMMARY OF THE INVENTION

Power consumption in a circuit generating a substrate bias voltage for varying a threshold voltage of an element should also be taken into account.

The present disclosure was made to solve the problems above, and an object is to provide a semiconductor device capable of achieving reduction in power consumption in a semiconductor chip as a whole.

Other objects and novel features will become apparent from the description herein and the accompanying drawings.

According to one example, a semiconductor device includes a substrate, a circuit having a transistor formed on the substrate, an oscillation circuit generating a frequency signal, a substrate voltage generation circuit generating a substrate voltage in accordance with the frequency signal from the oscillation circuit, and a control circuit varying a frequency of the frequency signal from the oscillation circuit during a stand-by period of the circuit.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment will be described in detail with reference to the drawings. The same or corresponding elements in the drawings have the same reference characters allotted and description thereof will not be repeated.

Figure 1:
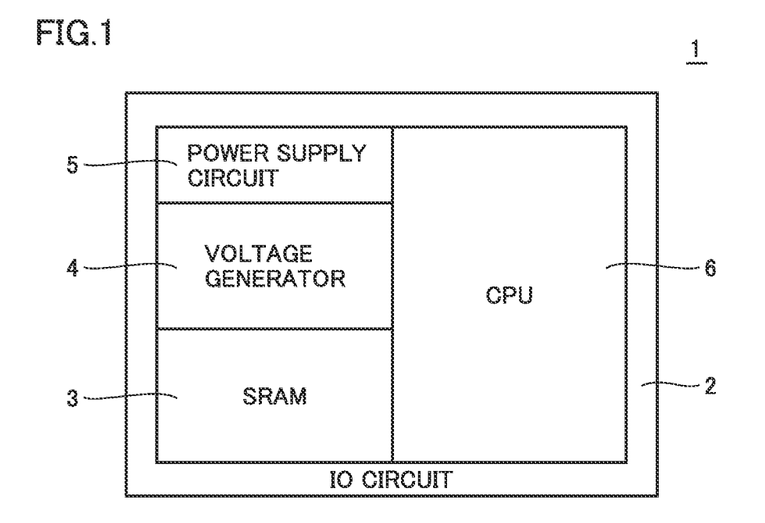
FIG. 1 is a diagram illustrating a configuration of a semiconductor chip 1 based on an embodiment.

FIG. 1 is a diagram illustrating a configuration of a semiconductor chip 1 based on an embodiment.

As shown in FIG. 1, semiconductor chip 1 includes an IO circuit 2 having an input and output interface function, a static random access memory (SRAM) 3 representing a memory, a voltage generator 4, a power supply circuit 5 supplying various power supply voltages, and a central processing unit (CPU) 6. Power supply circuit 5 may generate and supply a power supply voltage VDD and a ground voltage VSS and may supply a voltage to other circuits upon receiving an external input. Voltage generator 4 includes a circuit generating a substrate bias voltage.

Figure 2:
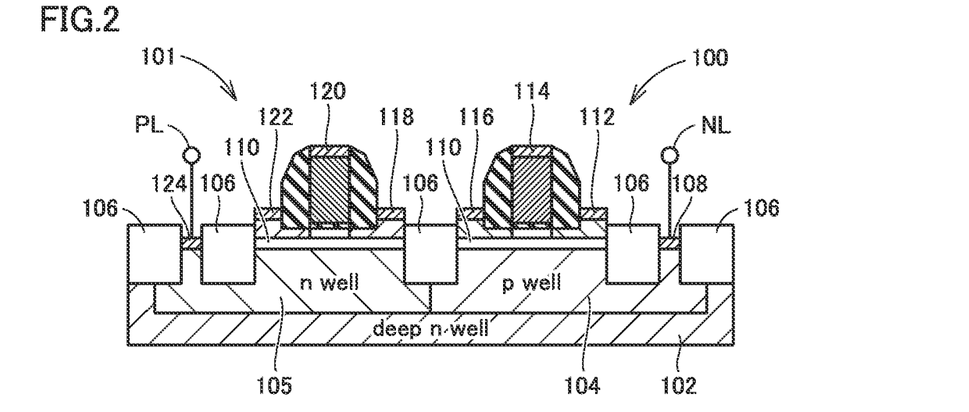
FIG. 2 is a cross-sectional view of a structure of a transistor implementing a CPU based on the embodiment.

FIG. 2 is a cross-sectional view of a structure of a transistor implementing the CPU based on the embodiment.

FIG. 2 shows an N-channel MOS transistor 100 and a P-channel MOS transistor 101 as transistors having an SOTB structure.

A well region 104 is formed on an upper side of SOI substrate 102. Well region 104 is a p-type semiconductor region in which a p-type impurity has been introduced.

A substrate bias electrode 108 for N-channel MOS transistor 100 is provided on well region 104. An element isolation film 106 is provided on opposing sides of substrate bias electrode 108. Substrate bias electrode 108 is connected to a power supply line NL A gate electrode 114, a source electrode 112, and a drain electrode 116 are provided on a surface of the transistor with a BOX layer 110 being interposed.

Element isolation film 106 is provided in a boundary region between the N-channel MOS transistor and an adjacent P-channel MOS transistor.

A well region 105 is formed on the upper side of SOI substrate 102.

Well region 105 is an n-type semiconductor region in which an n-type impurity has been introduced.

A substrate bias electrode 124 for P-channel MOS transistor 101 is provided on well region 105. Element isolation film 106 is provided on opposing sides of substrate bias electrode 124. Substrate bias electrode 124 is connected to a power supply line PL A gate electrode 120, a source electrode 122, and a drain electrode 118 are provided on the surface of the transistor with BOX layer 110 being interposed.

Figure 3A:
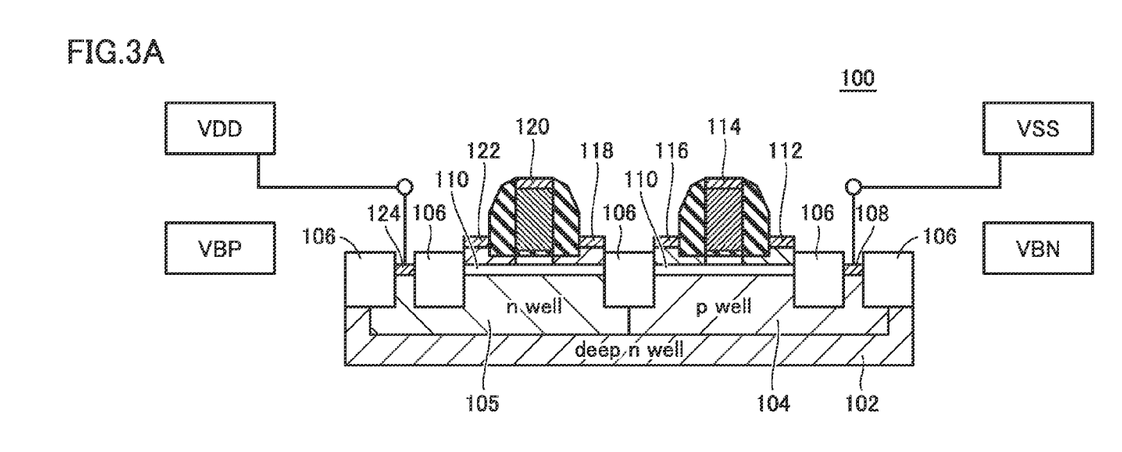
FIGS. 3A and 3B are diagrams illustrating a substrate bias voltage applied to the transistor based on the embodiment.
Figure 3B:
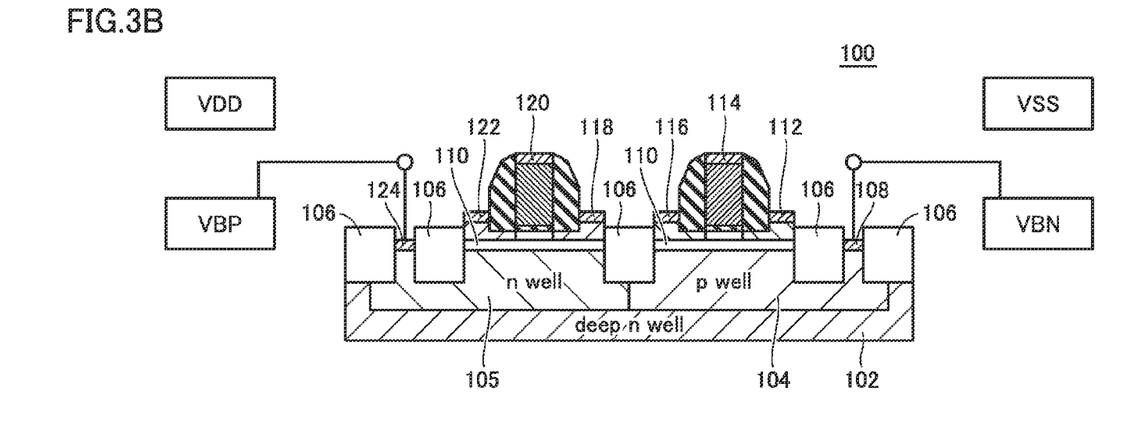

FIGS. 3A and 3B are diagrams illustrating a substrate bias voltage applied to the transistor based on the embodiment.

FIG. 3A shows a state of application of a substrate bias voltage in an active mode. Specifically, ground voltage VSS is supplied as a substrate bias voltage to the N-channel MOS transistor. Power supply voltage VDD is supplied as a substrate bias voltage to the P-channel MOS transistor.

FIG. 3B shows a state of application of a substrate bias voltage in a stand-by mode.

Specifically, a voltage VBN is supplied as a substrate bias voltage to the N-channel MOS transistor. A voltage VBP is applied as a substrate bias voltage to the P-channel MOS transistor. Voltage VBN is a negative voltage lower than ground voltage VSS. Voltage VBP is a positive voltage higher than voltage VDD.

Figure 4:
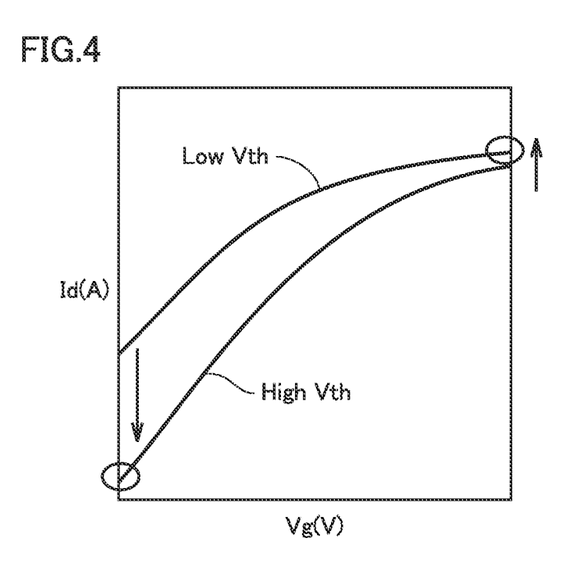
FIG. 4 is a diagram illustrating characteristics of the transistor based on variation in threshold voltage.

FIG. 4 is a diagram illustrating characteristics of the transistor based on variation in threshold voltage.

FIG. 4 shows low-threshold-value (Low Vth) transistor characteristics and high-threshold-value (High Vth) transistor characteristics.

With variation in threshold voltage from a low threshold value to a high threshold value, the characteristics of the transistor vary. In the present example, characteristics of the transistor are varied by switching a substrate bias voltage to be applied between the active mode and the stand-by mode.

Specifically, in the active mode, a substrate bias voltage is applied to exhibit the low-threshold-value transistor characteristics, and in the stand-by mode, a substrate bias voltage is applied to exhibit the high-threshold-value transistor characteristics.

Figure 5:
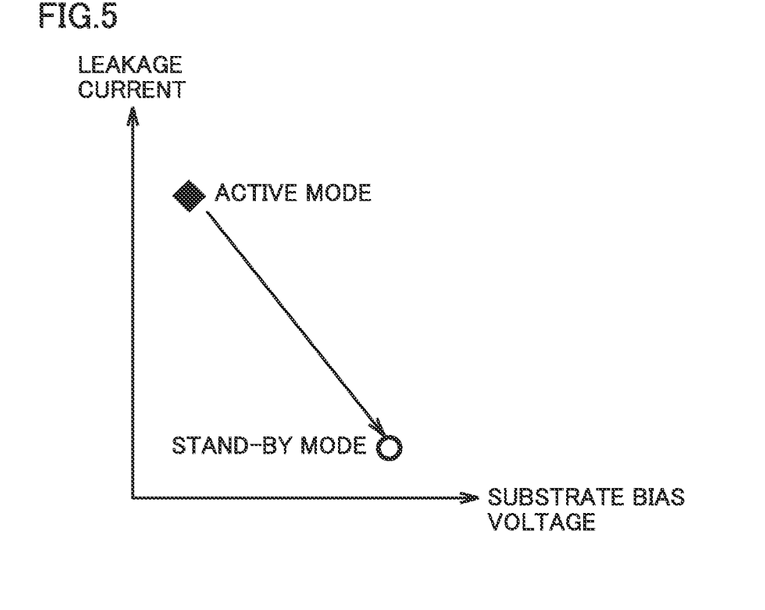
FIG. 5 is a diagram illustrating a leakage current in an active mode and a stand-by mode.

FIG. 5 is a diagram illustrating a leakage current in the active mode and the stand-by mode.

As shown in FIG. 5, a substrate bias voltage is increased when transition from the active mode to the stand-by mode is made. For example, an example of the P-channel MOS transistor is described.

Thus, the low-threshold-value transistor characteristics are varied to the high-threshold-value transistor characteristics and a leakage current decreases in the stand-by mode.

Figure 6:
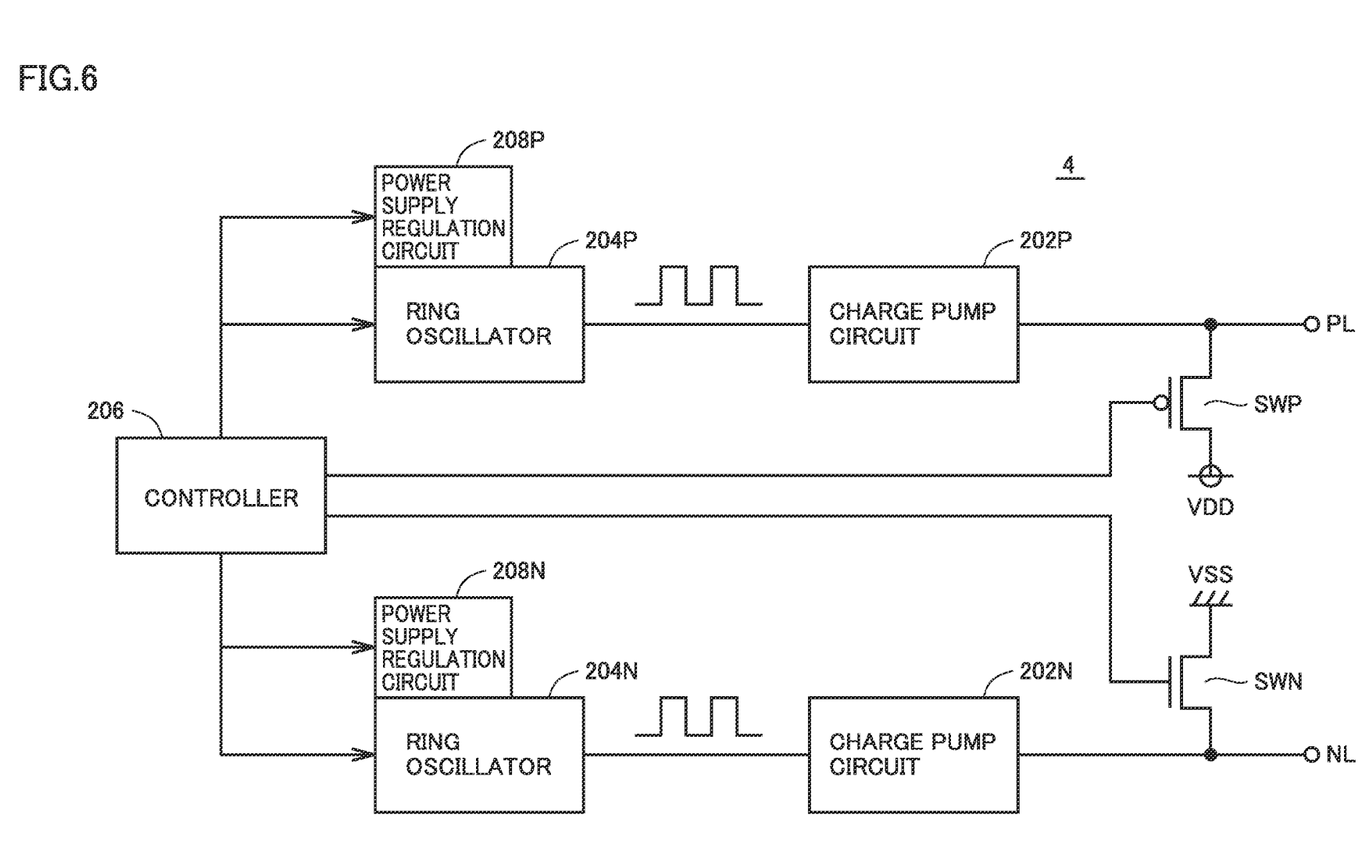
FIG. 6 is a block diagram illustrating a configuration of a voltage generator 4 based on the embodiment.

FIG. 6 is a block diagram illustrating a configuration of voltage generator 4 based on the embodiment.

As shown in FIG. 6, voltage generator 4 includes a controller 206, ring oscillators 204P and 204N (which are collectively referred to as a ring oscillator 204), power supply regulation circuits 208P and 208N (which are collectively referred to as a power supply regulation circuit 208), charge pump circuits 202P and 202N (which are collectively referred to as a charge pump circuit 202), and transistors SWP and SWN. The sign "P" means a circuit for a P-channel MOS transistor and the sign "N" means a circuit for an N-channel MOS transistor.

Ring oscillator 204P generates an oscillation signal (a frequency signal) to be output to charge pump circuit 202P.

Ring oscillator 204N generates an oscillation signal (a frequency signal) to be output to charge pump circuit 202N.

Power supply regulation circuit 208P regulates a level of a voltage to be supplied to ring oscillator 204P.

Power supply regulation circuit 208N regulates a level of a voltage to be supplied to ring oscillator 204N.

Ring oscillator 204P regulates a frequency of the oscillation signal in accordance with the voltage level input through power supply regulation circuit 208P.

Ring oscillator 204N regulates a frequency of the oscillation signal in accordance with the voltage level input through power supply regulation circuit 208N.

By way of example, a high frequency of the oscillation signal can be set by setting a high voltage level.

Transistor SWP is provided between power supply voltage VDD and power supply line PL and has a gate receiving an input of a control signal from controller 206.

Transistor SWN is provided between ground voltage VSS and power supply line NL and has a gate receiving an input of a control signal from controller 206.

Controller 206 outputs various control signals in the active mode and the stand-by mode and supplies a substrate bias voltage to each of power supply lines PL and NL.

Specifically, controller 206 outputs a control signal (at the "L" level) to the gate of transistor SWP in the active mode. It outputs a control signal (at the "H" level) to the gate of transistor SWN.

In response, transistors SWP and SWN are activated. Power supply line PL is connected to power supply voltage VDD. Power supply line NL is connected to ground voltage VSS. Power supply voltage VDD is supplied to the P-channel MOS transistor as the substrate bias voltage. Ground voltage VSS is supplied as the substrate bias voltage to the N-channel MOS transistor.

Controller 206 outputs a control signal (at the "H" level) to the gate of transistor SWP in the stand-by mode. It outputs a control signal (at the "L" level) to the gate of transistor SWN. In response, transistors SWP and SWN are deactivated. Controller 206 instructs ring oscillators 204P and 204N and power supply regulation circuits 208P and 208N to have respective ring oscillators 204P and 204N output oscillation signals. Controller 206 varies frequencies of the oscillation signals output from respective ring oscillators 204P and 204N during a stand-by period in the stand-by mode.

The oscillation signals generated by ring oscillators 204P and 204N are input to respective charge pump circuits 202P and 202N.

Charge pump circuit 202P performs a step-up operation so as to output voltage VBP higher than power supply voltage VDD in accordance with the oscillation signal generated by ring oscillator 204P.

Charge pump circuit 202N performs a step-down operation so as to output voltage VBN lower than ground voltage VSS in accordance with the oscillation signal generated by ring oscillator 204N.

In the stand-by mode, voltage VBP stepped up by charge pump circuit 202P is supplied to power supply line PL. Voltage VBN stepped down by charge pump circuit 202N is supplied to power supply line NL. Therefore, voltage VBP is supplied as the substrate bias voltage to the P-channel MOS transistor. Voltage VBN is supplied as the substrate bias voltage to the N-channel MOS transistor.

Figure 7A:
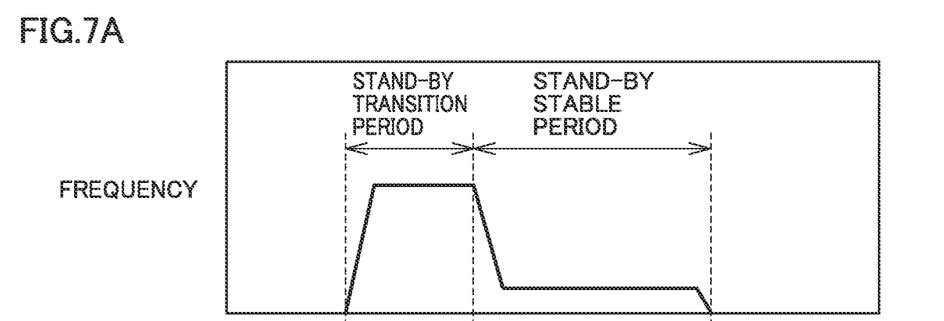
FIGS. 7A and 7B are diagrams illustrating regulation of a frequency of an oscillation signal from a ring oscillator and electric power in the stand-by mode based on the embodiment.
Figure 7B:
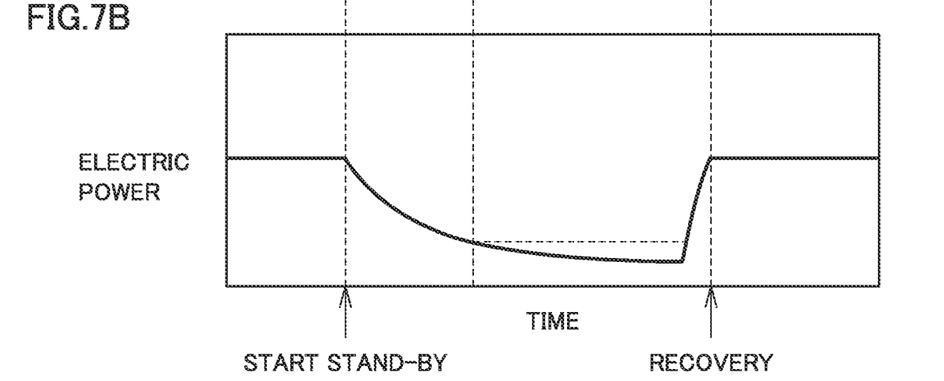

FIGS. 7A and 7B are diagrams illustrating regulation of a frequency of an oscillation signal from a ring oscillator and electric power in the stand-by mode based on the embodiment.

As shown in FIG. 7A, during a stand-by transition period in which transition from the active mode to the stand-by mode is made, controller 206 instructs power supply regulation circuits 208P and 208N to set frequencies of the oscillation signals generated by ring oscillators 204P and 204N to be high.

In response, the substrate bias voltages output from charge pump circuits 202P and 202N can be set to desired voltage levels in an early stage. During the stand-by transition period, a desired voltage level is set in an early stage.

During a stand-by stable period after the desired voltage levels are set, that is, after the stand-by transition period has elapsed, a low frequency is set. During the stand-by stable period following the stand-by transition period, controller 206 instructs power supply regulation circuits 208P and 208N to set frequencies of the oscillation signals generated by ring oscillators 204P and 204N to be low.

In response, while the substrate bias voltages output from charge pump circuits 202P and 202N are maintained at desired voltages, power consumption in ring oscillators 204P and 204N can be reduced.

As shown in FIG. 7B, during the stand-by transition period, as the substrate bias voltage is set, a threshold voltage of the transistor is set to be high. In response, the leakage current decreases and power consumption can be reduced.

Therefore, since power consumption in ring oscillator circuits and the charge pump circuits becomes low, power consumption can further be reduced.

When frequencies of the oscillation signals from ring oscillators 204P and 204N are not varied, power consumption is as shown with a dotted line. By reducing power consumption in the ring oscillator circuits and the charge pump circuits, the semiconductor chip as a whole can achieve further power saving.

Figure 8:
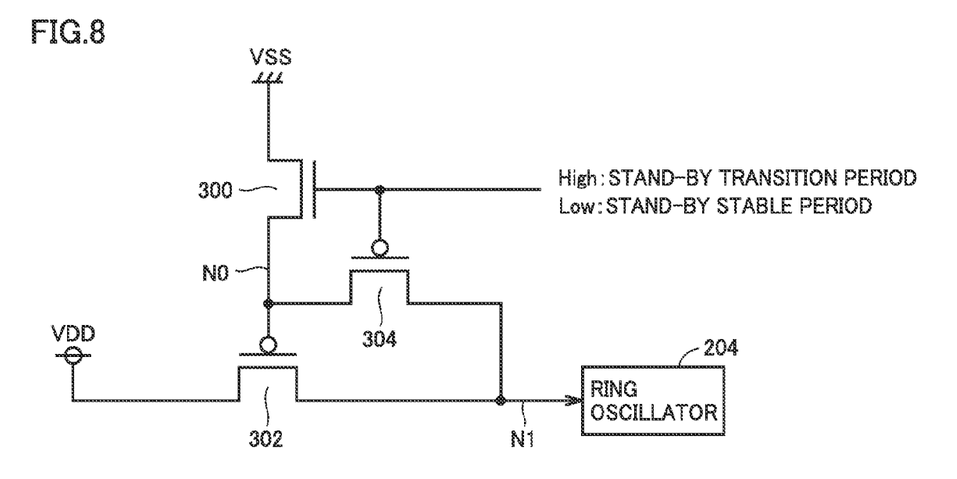
FIG. 8 is a diagram illustrating a circuit configuration of a power supply regulator based on the embodiment.

FIG. 8 is a diagram illustrating a circuit configuration of power supply regulation circuit 208P based on the embodiment.

As shown in FIG. 8, power supply regulation circuit 208P includes transistors 300 to 304.

Transistor 300 is an N-channel MOS transistor. Transistors 302 and 304 are P-channel MOS transistors.

Transistor 302 is arranged between power supply voltage VDD and a power supply input node N1 of ring oscillator 204 and has a gate connected to an internal node N0.

Transistor 304 is provided between internal node N0 and a power supply input node N1 of ring oscillator 204 and has a gate receiving an input of a control signal.

Transistor 300 is provided between ground voltage VSS and internal node N0 and has a gate receiving an input of a control signal. The control signal is output from controller 206.

Controller 206 outputs a control signal (at the "H" level) to power supply regulation circuit 208P during the stand-by transition period. It outputs a control signal (at the "L" level) during the stand-by stable period.

When the control signal is set to the "H" level, transistor 300 is rendered conducting. In response, the gate of transistor 302 is connected to ground voltage VSS. Therefore, transistor 302 is rendered conducting and power supply voltage VDD is supplied to power supply input node N1 of ring oscillator 204.

When the control signal is set to the "L" level, transistor 300 is turned off whereas transistor 304 is rendered conducting. As transistor 304 is rendered conducting, internal node N0 is electrically connected to power supply input node N1 of ring oscillator 204.

Therefore, transistor 302 is diode-connected. Therefore, a voltage lower by the threshold voltage of transistor 302 is supplied from power supply voltage VDD to power supply input node N1. A frequency of the oscillation signal from ring oscillator 204 is thus regulated.

This is also similarly applicable to power supply regulation circuit 208N.

Figure 9:
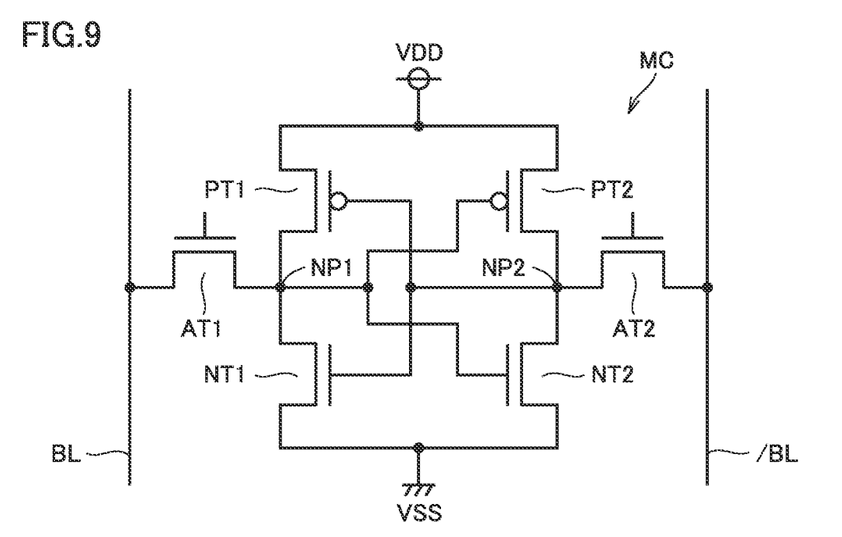
FIG. 9 is a diagram illustrating a configuration of a memory cell MC of an SRAM 3 based on the embodiment.

FIG. 9 is a diagram illustrating a configuration of a memory cell MC of SRAM 3 based on the embodiment.

FIG. 9 shows a configuration of memory cell MC. Memory cell MC is constituted of two transfer transistors AT1 and AT2, drive transistors NT1 and NT2, and load transistors PT1 and PT2 (load elements).

Load transistor PT1 and drive transistor NT1 are connected in series between power supply voltage VDD and ground voltage VSS and have their gates connected to a storage node NP2.

Load transistor PT2 and drive transistor NT2 are connected in series between power supply voltage VDD and ground voltage VSS and have their gates connected to a storage node NP1.

A node of connection between load transistor PT1 and drive transistor NT1 forms storage node NP1.

A node of connection between load transistor PT2 and drive transistor NT2 forms storage node NP2.

Transfer transistor AT1 is connected between storage node NP1 and a bit line BL and has a gate connected to a word line Transfer transistor AT2 is connected between storage node NP2 and a bit line/BL and has a gate connected to a word line.

Though a configuration for supplying a substrate bias voltage of a transistor implementing a CPU has been described, the configuration is similarly applicable also to a substrate bias voltage of a transistor of memory cell MC implementing a memory.

Though an embodiment of the present invention has been described, it should be understood that the embodiment disclosed herein is illustrative and non-restrictive in every respect. The scope of the present invention is defined by the terms of the claims and is intended to include any modifications within the scope and meaning equivalent to the terms of the claims.

What is claimed is:

1. A semiconductor device comprising:
a substrate;

a circuit having a transistor formed on the substrate;
an oscillation circuit generating a frequency signal;
a substrate voltage generation circuit generating a substrate voltage in accordance with the frequency signal from the oscillation circuit; and
a control circuit varying a frequency of the frequency signal from the oscillation circuit during a stand-by period of the circuit,
wherein the stand-by period of the circuit includes a stand-by transition period in which transition from an active state to a stand-by state of the circuit is made and a stand-by stable period in which the stand-by state is maintained,
wherein the control circuit sets a frequency of the frequency signal from the oscillation circuit differently between the stand-by transition period and the stand-by stable period, and
wherein the control circuit sets a frequency of the frequency signal from the oscillation circuit during the stand-by transition period to be higher than a frequency of the frequency signal from the oscillation circuit during the stand-by stable period.

2. The semiconductor device according to claim 1, wherein
the oscillation circuit generates a frequency signal of a frequency in accordance with an input voltage, and
the control circuit sets an input voltage input during the stand-by stable period to be lower than an input voltage input during the stand-by transition period.

3. The semiconductor device according to claim 2, the semiconductor device further comprising a regulation circuit regulating a voltage level of the input voltage input to the oscillation circuit, wherein
the control circuit instructs the regulation circuit to set the input voltage input during the stand-by stable period to be lower than the input voltage input during the stand-by transition period.

4. The semiconductor device according to claim 3, wherein
the regulation circuit includes a switch transistor provided between a power supply voltage input as the input voltage and the oscillation circuit, and
the control circuit renders the switch transistor conducting during the stand-by transition period and has the switch transistor diode-connected during the stand-by stable period.

5. The semiconductor device according to claim 1, wherein
the circuit is a memory.

6. The semiconductor device according to claim 5, wherein
the memory is a static random access memory (SRAM).

7. The semiconductor device according to claim 1, wherein
the transistor has a silicon on thin buried oxide (SOTB) structure.

* * * * *